United States Patent
Kang

(10) Patent No.: US 7,012,828 B2
(45) Date of Patent: Mar. 14, 2006

(54) DATA CONTROL DEVICE USING A NONVOLATILE FERROELECTRIC MEMORY

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 94 days.

(21) Appl. No.: 10/742,394

(22) Filed: Dec. 22, 2003

(65) Prior Publication Data
US 2005/0078502 A1   Apr. 14, 2005

(30) Foreign Application Priority Data
Oct. 13, 2003 (KR) .................. 10-2003-0071010

(51) Int. Cl.
*G11C 11/22* (2006.01)
(52) U.S. Cl. .................. 365/145; 365/117; 365/65
(58) Field of Classification Search ........ 365/145, 365/189.04, 207, 192, 189.09
See application file for complete search history.

(56) References Cited

U.S. PATENT DOCUMENTS

| | | | |
|---|---|---|---|
| 6,230,325 B1 * | 5/2001 | Iinuma et al. | 725/110 |
| 6,272,594 B1 | 8/2001 | Gupta et al. | |
| 6,363,439 B1 | 3/2002 | Battles et al. | |
| 2003/0046453 A1 * | 3/2003 | Hisano | 710/5 |
| 2003/0225572 A1 * | 12/2003 | Adams et al. | 704/201 |

* cited by examiner

*Primary Examiner*—Thong Q. Le
(74) *Attorney, Agent, or Firm*—Heller Ehrman LLP

(57) ABSTRACT

A data control device using a nonvolatile ferroelectric memory stores radio data having different types in a memory cell, thereby reducing a chip size. In the data control device, radio data such as image data, sound data and other data encoded as analog signals are stored in a unit cell including a nonvolatile ferroelectric capacitor. The analog data stored in a cell array block are converted into digital signals, and outputted, thereby reducing the configuration of adjacent systems and improving performance.

20 Claims, 14 Drawing Sheets

DATA CONTROL DEVICE USING A NONVOLATILE FERROELECTRIC MEMORY

BACKGROUND OF THE INVENTION

1. Field of the Invention

The present invention generally relates to a data control device using a nonvolatile ferroelectric memory, and more specifically, to a technology for storing and sensing multi-bit radio data having different types in a ferroelectric memory cell.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

As a radio system for transmitting image data and sound data wirelessly is generalized, the configuration to reduce power consumption and improve performance of the radio system has been required.

The conventional radio system basically needs a plurality of memories such as a volatile memory and a nonvolatile memory for storing and sensing data in embodiment of the device which reduces power consumption and improve performance. Thus, the configuration of adjacent systems to control related memories becomes complicated, which results in increase of the whole area of the radio system and degradation of system performance.

As a result, a technology is necessary for storing multi-bit data such as sound data, image data and the rest data in a unit cell using the above-describe FeRAM and for increasing availability of cell size, thereby reducing the whole area of the system.

SUMMARY OF THE INVENTION

Accordingly, it is an object to unite a plurality memories for transmitting/receiving radio data into a nonvolatile ferroelectric memory, and to store and sense a plurality of multi data having different types in a unit cell, thereby decreasing the whole area of the system.

In an embodiment, a data control device using a nonvolatile ferroelectric memory comprises a radio data processing unit and a FeRAM memory unit. The radio data processing unit converts radio data having different types into digital/analog signals, and transmits/receives the converted signals wirelessly. The FeRAM memory unit encodes the radio data having different types and stores the encoded data in unit cells of a nonvolatile ferroelectric memory, respectively, compares a plurality of different cell data sensing voltages sensed in the nonvolatile ferroelectric memory with a plurality of previously set reference voltages, and converts the comparison results into digital signals to output the converted signals into the radio data processor.

In another embodiment, a data control device using a nonvolatile ferroelectric memory comprises a data processing unit and a FeRAM memory unit. The data processing unit converts a plurality of data having different types into signals, and transmits/receives the signals. The FeRAM memory unit encodes the plurality of data having different types and storing the encoded data in unit cells of a nonvolatile ferroelectric memory, and compares a plurality of cell different data sensing voltages sensed in the nonvolatile ferroelectric memory with a plurality of preset reference voltages and outputting the comparison results into the data processing unit.

DETAILED DESCRIPTION OF THE PREFERRED EMBODIMENTS

The present invention will be described in detail with reference to the accompanying drawings.

Figure 1:
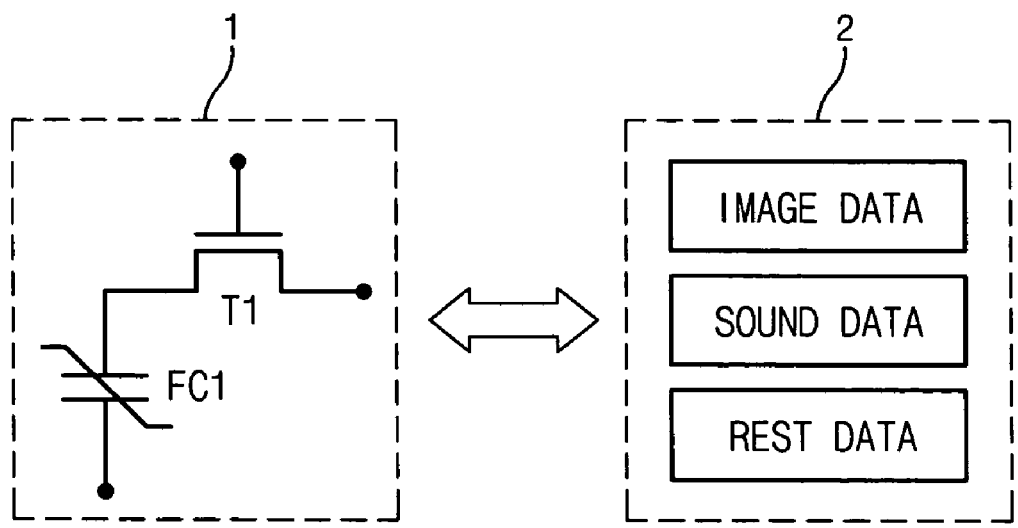
FIG. 1 is a diagram illustrating the concept of a data control device using a nonvolatile ferroelectric memory according to an embodiment of the present invention.

FIG. 1 is a diagram illustrating the concept of a data control device using a nonvolatile ferroelectric memory according to an embodiment of the present invention.

In an embodiment, a unit cell 1 of the nonvolatile ferroelectric memory comprises a transistor T1 and a nonvolatile ferroelectric capacitor FC1. Thus, multiple bit data 2 having different types such as image data, sound data and the rest data can be stored in the unit cell 1.

Figure 2:
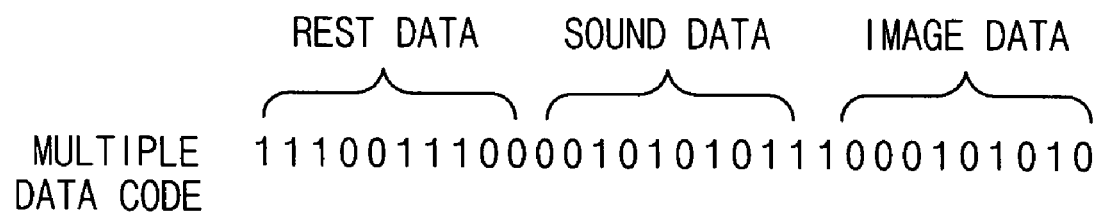
FIG. 2 is a diagram illustrating data codes stored in a unit cell of FIG. 1.

FIG. 2 is a diagram illustrating data codes stored in the unit cell 1 of FIG. 1.

In an embodiment, a plurality of data levels are encoded, and then stored in the unit cell 1 of the nonvolatile ferroelectric memory. Then, image data, sound data and other radio data are respectively assigned to data regions in the multiple data codes. For example, of multiple data, the rest data having relatively small error probability is encoded as "1110011100", sound data as "0010101011", and image data having large error probability as "1000101010".

In a write mode, these encoded digital data are converted into analog data, and stored in the corresponding unit cell 1. In a read mode, analog data stored in the unit cell 1 are converted into encoded digital data.

Figure 3:
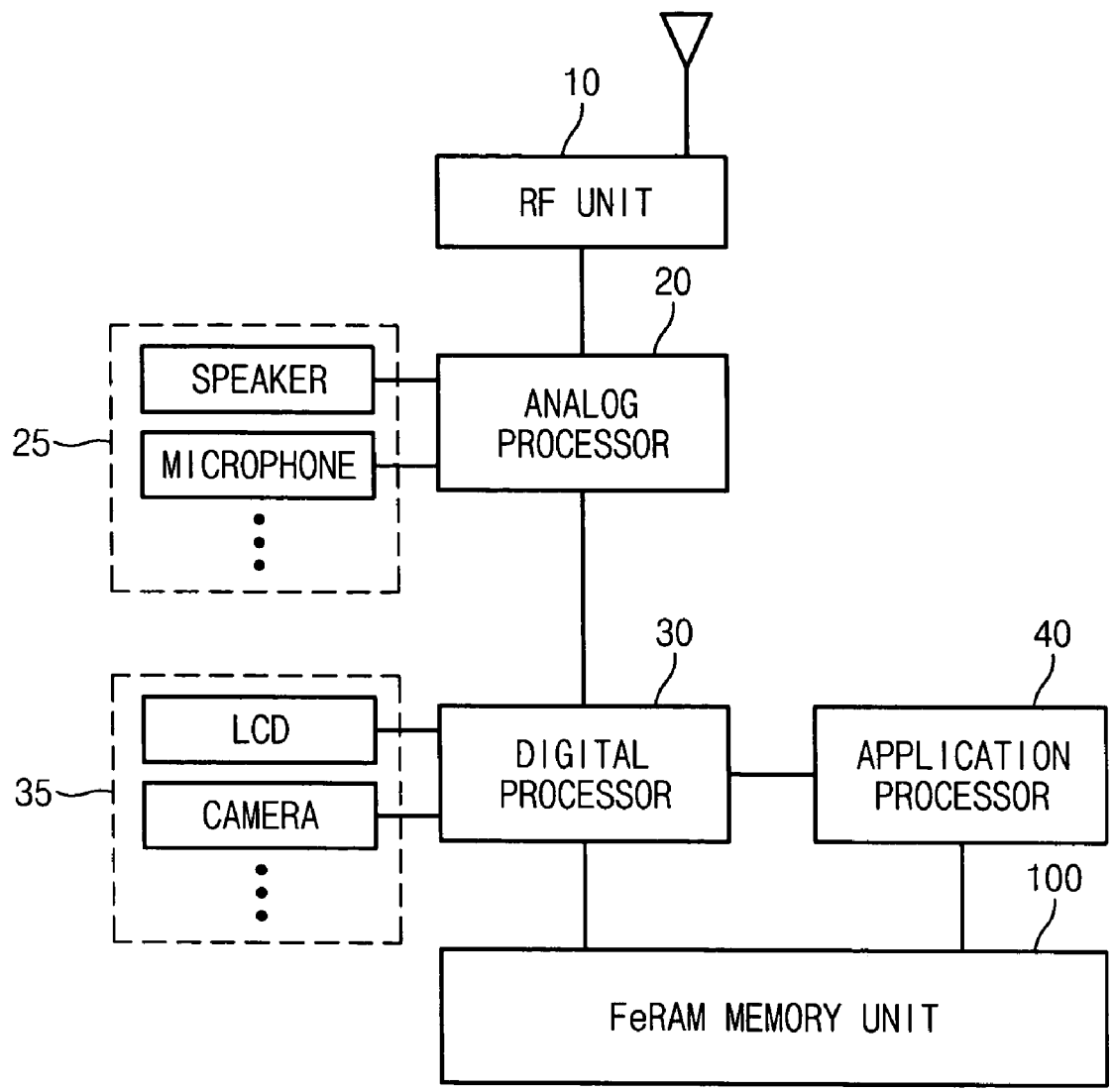
FIG. 3 is a block diagram illustrating a data control device using a nonvolatile ferroelectric memory according to an embodiment of the present invention.

FIG. 3 is a block diagram illustrating a data control device using a nonvolatile ferroelectric memory according to an embodiment of the present invention.

In an embodiment, the data control device comprises a radio frequency (hereinafter, abbreviated as "RF") unit 10, an analog processor 20, an analog data input/output unit 25, a digital processor 30, a digital data input/output unit 35, an application processor 40 and a FeRAM memory unit 100.

The RF unit 10, the analog processor 20, the analog data input/output unit 25, the digital processor 30, the digital data input/output unit 35, and the application processor 40 are included in a radio data processing unit for converting radio data having different types into digital/analog signals and transmitting/receiving the converted signals wirelessly.

The analog data input/output unit 25 may comprise a speaker and a microphone for outputting sound signals. The digital data input/output unit 35 may comprise a liquid crystal display and a camera for outputting image signals.

Figure 4:
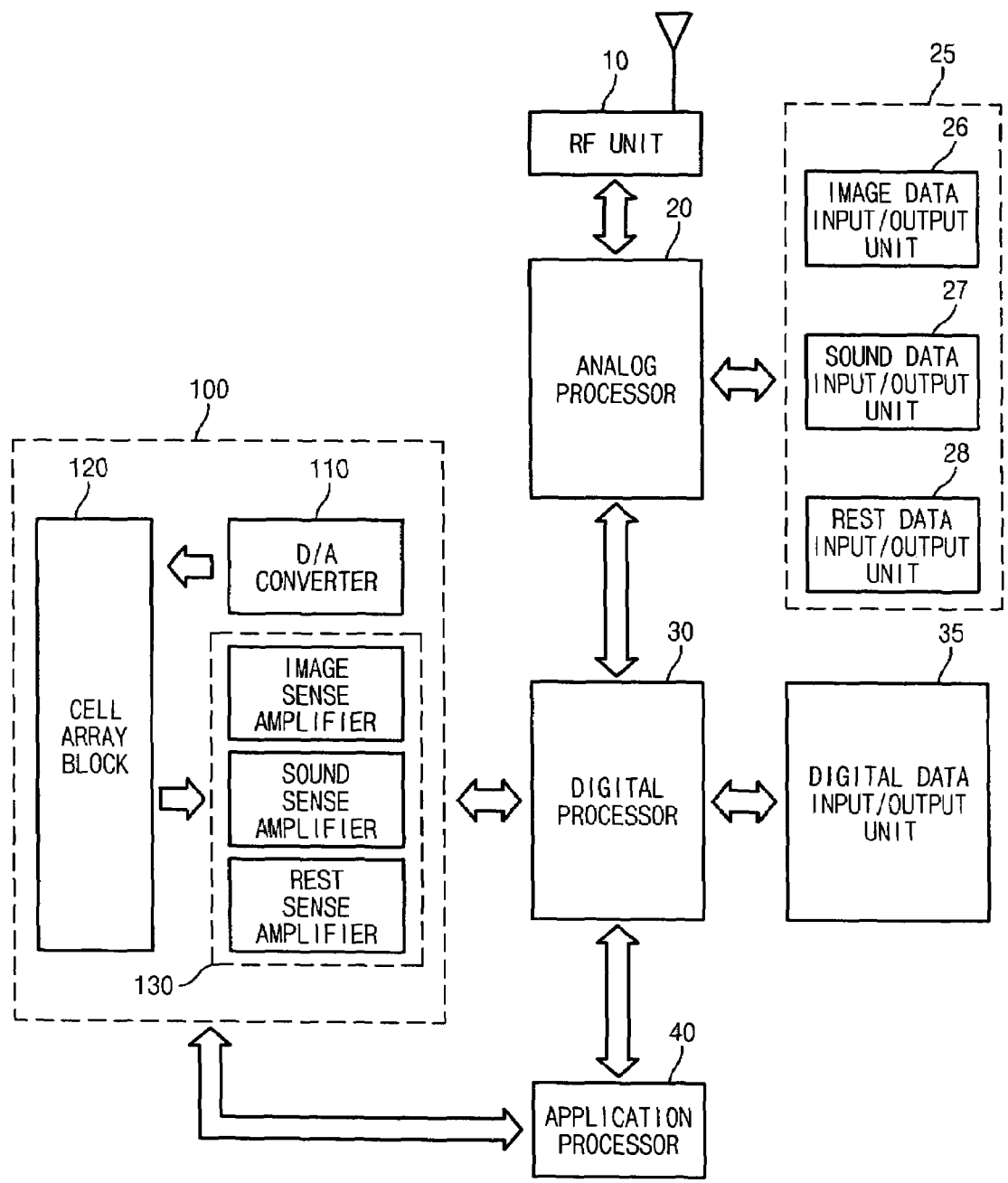
FIG. 4 is a block diagram of the data control device of FIG. 3.

FIG. 4 is a block diagram of the data control device of FIG. 3.

The RF unit 10 processes radio data inputted externally, and outputs the radio data into the analog processor 20. The analog processor 20 converts data applied from the RF unit 10 and the analog data input/output unit 25 into analog signals, and outputs the converted analog signals into the digital processor 30. The analog data input/output unit 25 which comprises an image data input/output unit 26, a sound data input/output unit 27 and a rest data input/output unit 28 exchanges analog data with the analog processor 20.

The digital processor 30 controls digital data which are inputted/outputted from the digital data input/output unit 35. The digital processor 30 converts analog data applied from the analog processor 20 into digital data.

The FeRAM memory unit 100 comprises a D/A (Digital/Analog) converter 110, a cell array block 120 and a sense amplifier array unit 130. The D/A converter 110 converts digital data inputted from the digital processor 30 in the write mode into analog data, and outputs the converted analog data into the cell array block 120.

The cell array block 120 assigns regions by assorting analog data applied from the D/A converter 110, and encodes the assorted data. The sense amplifier array unit 130 comprises an image sense amplifier for sensing image data, a sound sense amplifier for sensing sound data and a rest sense amplifier for sensing the rest radio data. The sense amplifier array unit 130 converts analog data stored in the cell array block 120 in the read mode into digital data, and outputs the converted digital data into the digital processor 30.

The application processor 40 which is connected to the digital processor 30 and the FeRAM memory unit 100 performs a process of additional application data.

Figure 5:
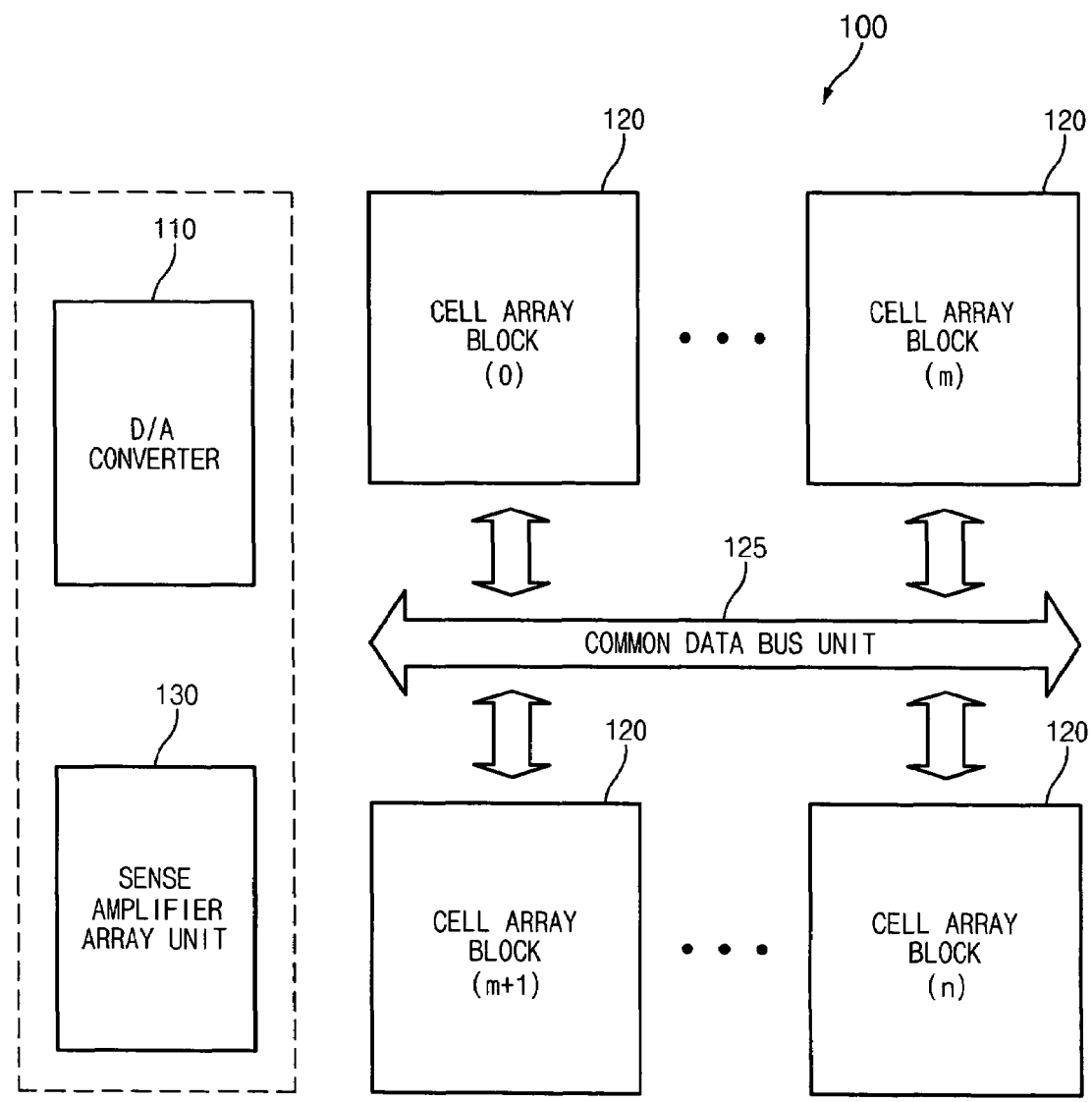
FIG. 5 is a diagram of the nonvolatile ferroelectric memory of FIG. 4.

FIG. 5 is a diagram of the FeRAM memory unit 100 of FIG. 4.

The FeRAM memory unit 100 comprises the D/A converter 110, the sense amplifier array unit 130, a plurality of cell array blocks 120 and a common data bus unit 125.

Each cell array block 120 comprises a plurality of cell arrays for storing data. The cell array has a multi-bitline structure comprising a plurality of sub bitlines and main bitlines wherein a sensing voltage of the sub bitline is converted into current to induce a sensing voltage of the main bitline. Here, the plurality of cell array blocks 120 share the common data bus unit 125. The D/A converter 110 and the sense amplifier array unit 130 exchange data with the cell array blocks through the common data bus unit 125.

In the read mode, data read from the cell array block 120 are stored in the sense amplifier array unit 130 through the common data bus unit 125. The read data stored in the sense amplifier array unit 130 are outputted into the digital processor 30.

However, in the write mode, data inputted through the digital processor 30 are converted into analog data by the D/A converter 110, and written in the cell array block 120 through the common data bus unit 125.

Figure 6:
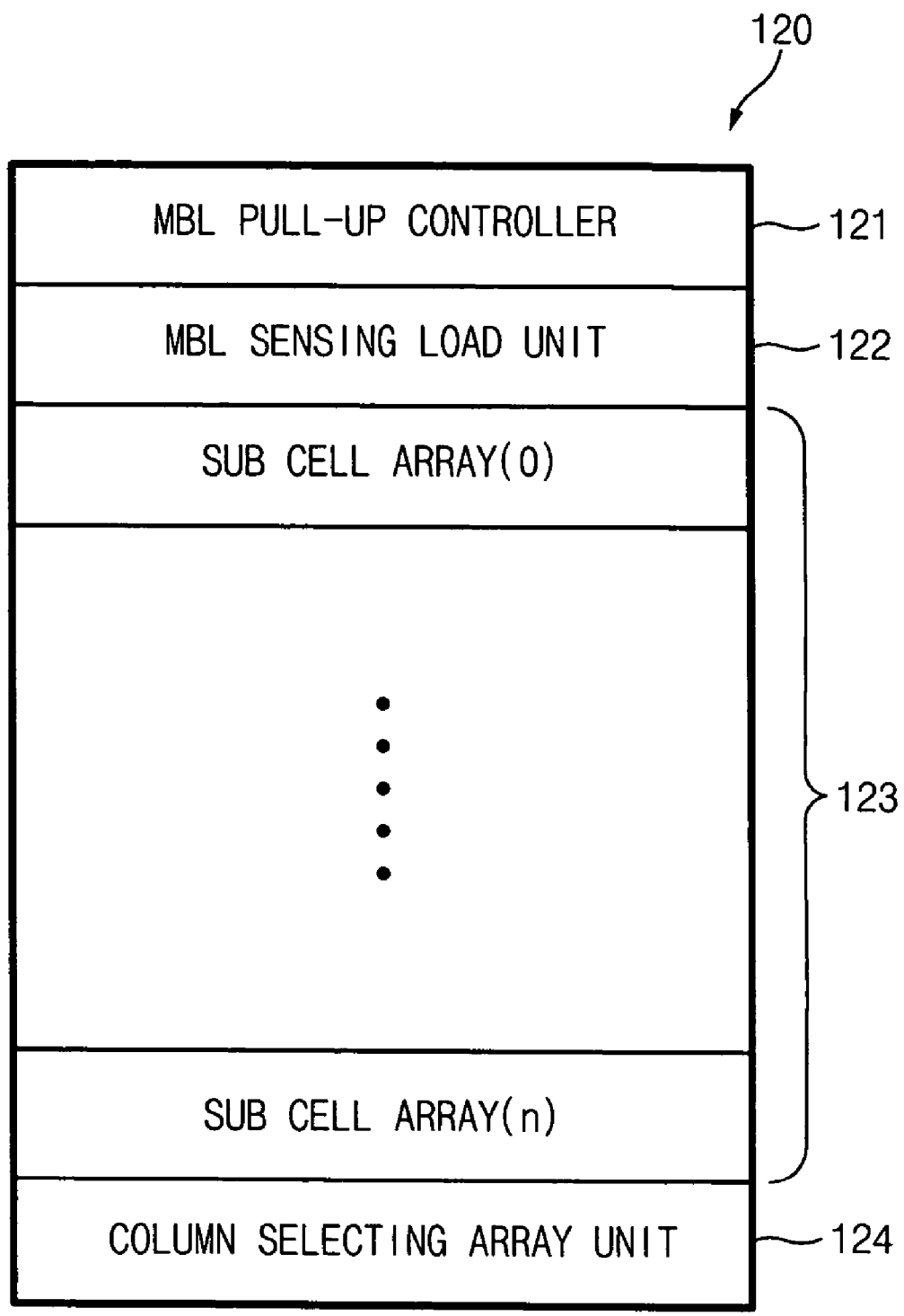
FIG. 6 is a diagram of a cell array block of FIG. 5.

FIG. 6 is a diagram of the cell array block 120 of FIG. 5.

The cell array block 120 comprises a main bitline (MBL) pull-up controller 121, a main bitline sensing load unit 122, a plurality of sub cell arrays 123 and a column selecting array unit 124.

Here, the main bitlines of the plurality of sub cell arrays 123 are connected to the common data bus unit 125 through the column selecting array unit 124.

Figure 7:
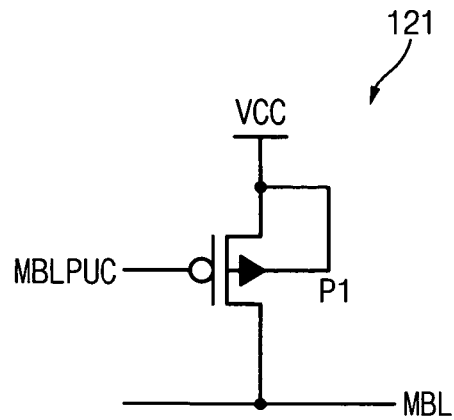
FIG. 7 is a circuit diagram of a main bitline pull-up controller of FIG. 6.

FIG. 7 is a circuit diagram of the main bitline pull-up ontroller of FIG. 6.

The MBL pull-up controller 121 comprises a PMOS transistor P1 for pulling up the main bitline MBL in a precharge mode. The PMOS transistor P1 has a source connected to a power voltage VCC terminal, a drain connected to the main bitline MBL and a gate to receive a main bitline pull-up control signal MBLPUC.

Figure 8:
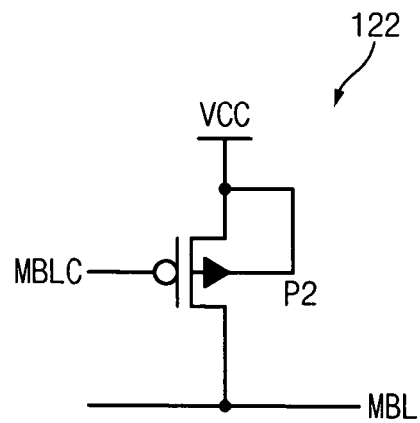
FIG. 8 is a circuit diagram of a main bitline sensing load unit of FIG. 6.

FIG. 8 is a circuit diagram of the main bitline sensing load unit 122 of FIG. 6.

The main bitline sensing load unit 122 comprises a PMOS transistor P2 for controlling sensing load of the main bitline MBL. The PMOS transistor P2 has a source connected to the power voltage VCC terminal, a drain connected to the main bitline MBL and a gate to receive a main bitline control signal MBLC.

Figure 9:
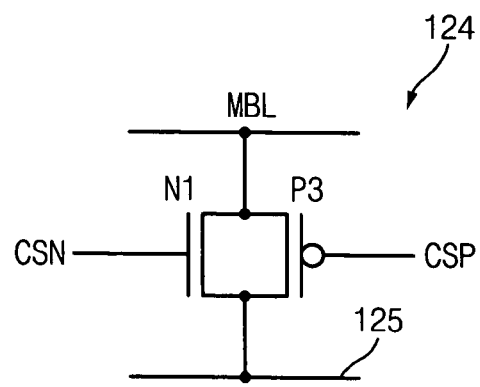
FIG. 9 is a circuit diagram of a column selecting array unit of FIG. 6.

FIG. 9 is a circuit diagram of the column selecting array unit 124 of FIG. 6.

The column selecting array unit 124 comprises an NMOS transistor N1 and a PMOS transistor P3. The NMOS transistor N1, connected between the main bitline MBL and the common data bus unit 125, has a gate to receive a column selecting signal CSN. The PMOS transistor P3, connected between the main bitline MBL and the common data bus unit 125, has a gate to receive a column selecting signal CSP. Here, the column selecting signal CSN has an opposite phase to the column selecting signal CSP.

Figure 10:
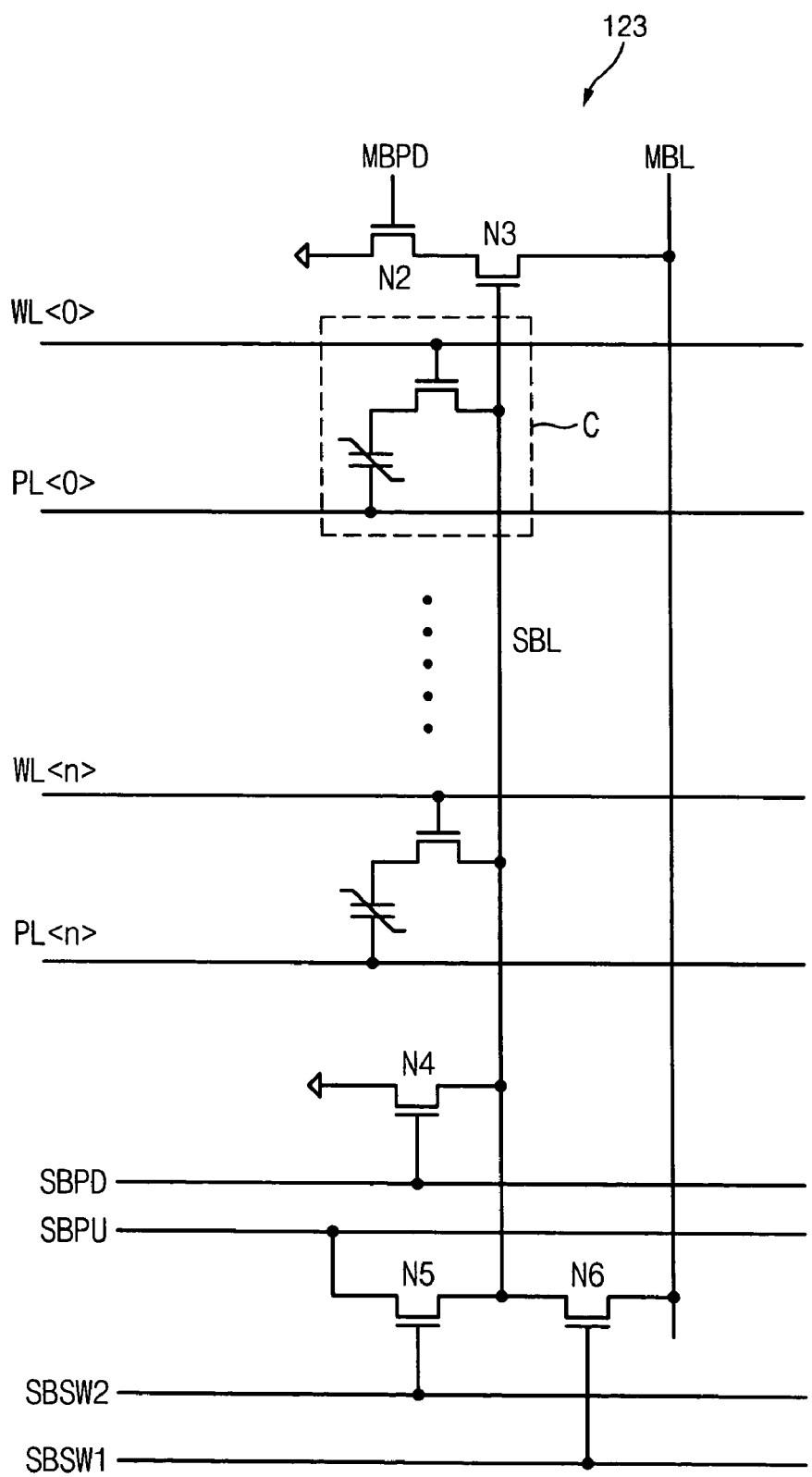
FIG. 10 is a circuit diagram of a sub cell array of FIG. 6.

FIG. 10 is a circuit diagram of the sub cell array 123 of FIG. 6.

Each main bitline MBL of the sub cell array 123 is selectively connected to one of a plurality of sub bitlines SBL. When one of a plurality of sub bitline selecting signals SBSW1 is activated, an NMOS transistor N6 is turned on to activate one sub bitline SBL. One sub bitline SBL is connected to a plurality of cells C.

When a sub bitline pull-down signal SBPD is activated, the NMOS transistor N4 is turned on to pull down the sub bitline SBL to a ground level. A sub bitline pull-up signal SBPU is to control power supplied to the sub bitline SBL. In a low voltage state, the sub bitline pull-up signal SBPU generates a voltage higher than the power voltage VCC and supplies the voltage to the sub bitline SBL.

A sub bitline selecting signal SBSW2 controls connection between a sub bitline pull-up signal SBPU terminal and the sub bitline SBL depending on switching of an NMOS transistor N5.

An NMOS transistor N3, connected between an NMOS transistor N2 and the main bitline MBL, has a gate connected to the sub bitline SBL. The NMOS transistor N2, connected between a ground voltage terminal and the NMOS transistor N3, has a gate to receive a main bitline pull-down signal MBPD, thereby regulating a sensing voltage of the main bitline MBL.

Figure 11:
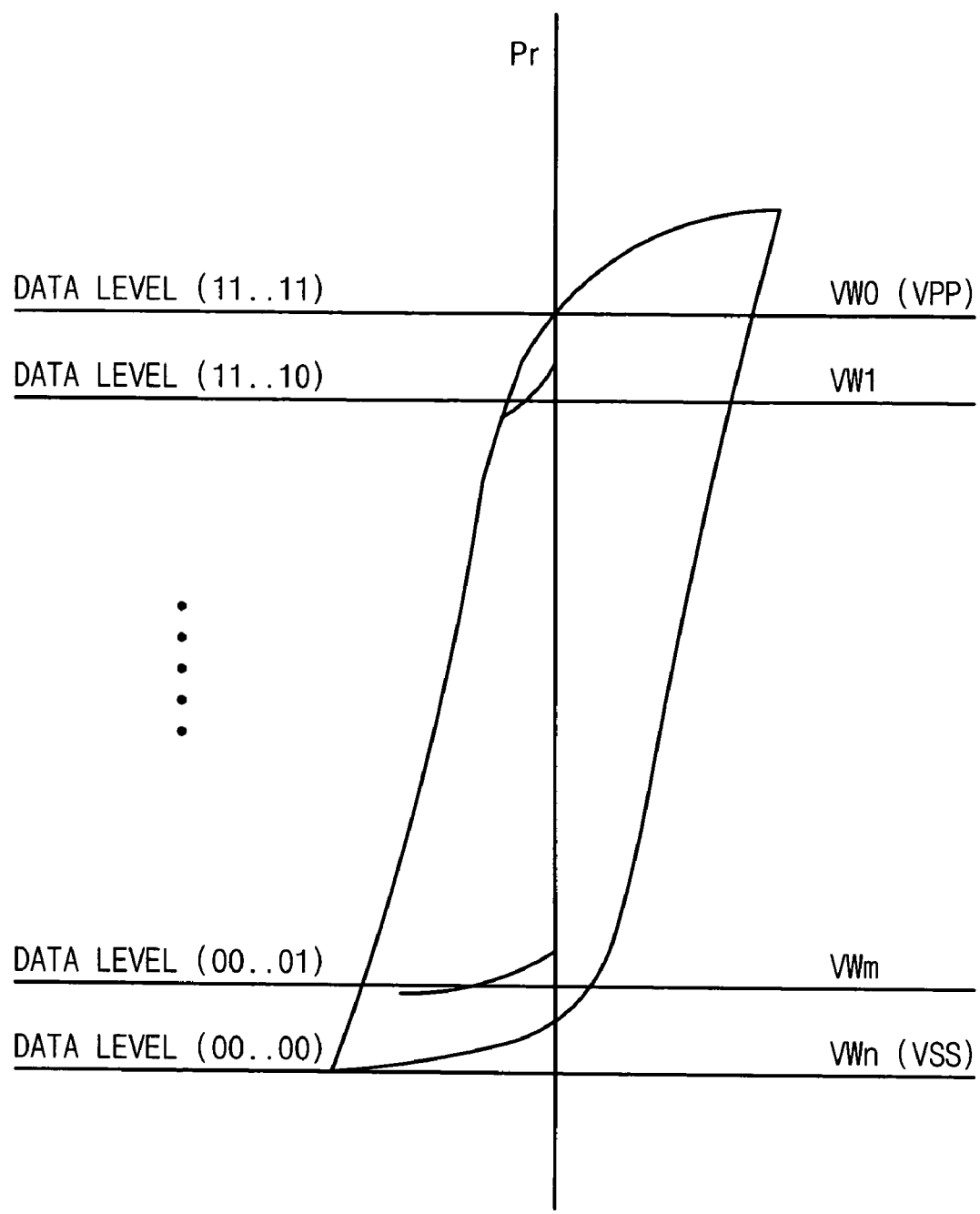
FIGS. 11 and 12 are diagrams illustrating multi-data levels.

FIG. 11 is a diagram illustrating n bit recording levels of the data control device using a nonvolatile ferroelectric memory.

For example, $4(2^2)$ level data is required to store 2 bits in a memory cell. That is, data levels of 00, 01, 10 and 11 are required. Thus, in order to store data of four levels in a cell, a voltage level is divided into VW0(VPP), VW1, VW2 and VW3 (VSS), and stored.

Hereinafter, the write operation of 2 bit data is described.

If a VW0(VPP) voltage is applied to a cell while the plateline PL is at the ground voltage VSS level, hidden data "1" is written in all cells.

Next, when a pumping voltage VPP is applied to the plateline PL, a voltage VW1 is applied to the sub bitline SBL and the main bitlines MBL to store a data level 10. As a result, a voltage VW0-VW1 is applied to the plateline PL and the sub bitline SBL. That is, the charge initially stored in the cell is reduced to that corresponding to the voltage VW0-VW1. Thus, a data level 11 transits to the data level 10.

Thereafter, data levels 01 and 00 are stored in the cell by applying different voltages VW2 and VW3 to the sub bitline SBL and the main bitline MBL.

Figure 12:
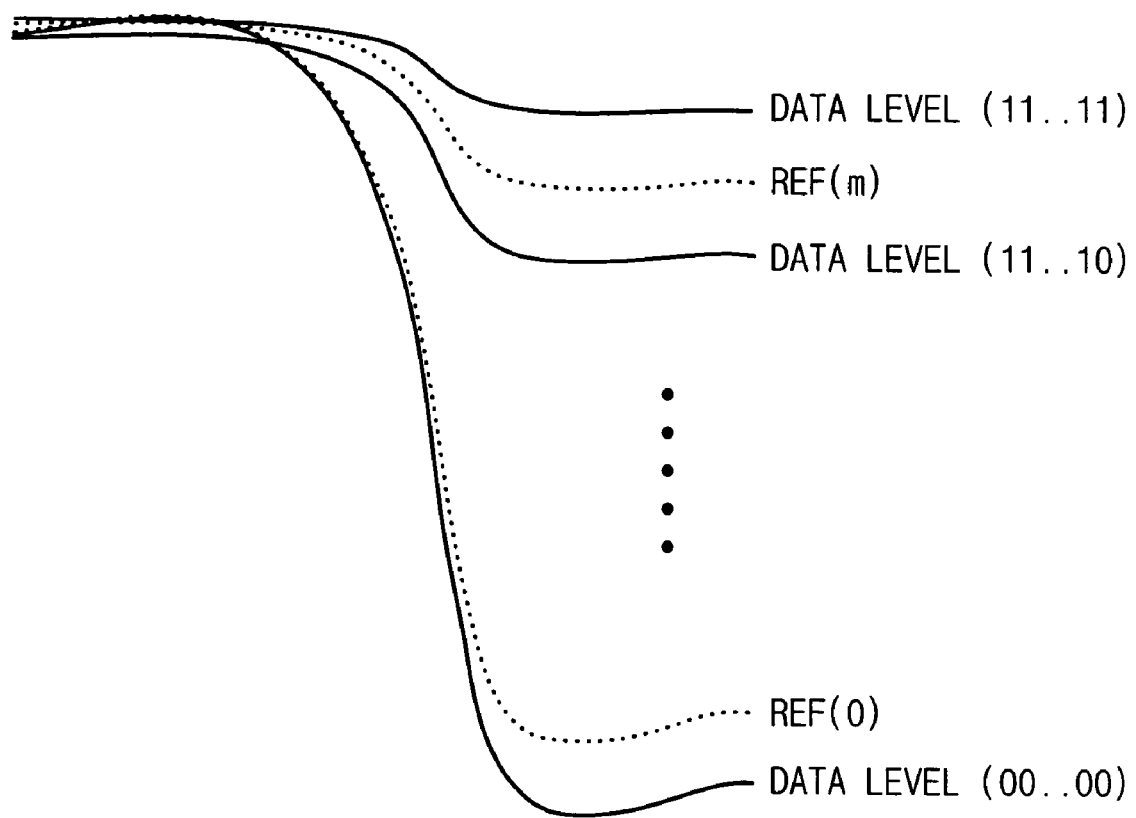

FIG. 12 is a diagram illustrating sensing levels of the data control device using a nonvolatile ferroelectric memory.

8 (in case of 2 bits) different sensing voltage levels are outputted into the sub bitline SBL depending on voltage levels of data stored in the memory cell of the cell array block 120. The sensing voltages of the sub bitline SBL are represented as $2^n$ data levels such as 111, 110, . . . , 001, 000 in the main bitline MBL. The $2^n$ data levels are compared and amplified with different reference voltages REF in the sense amplifier array unit 130.

Figure 13:
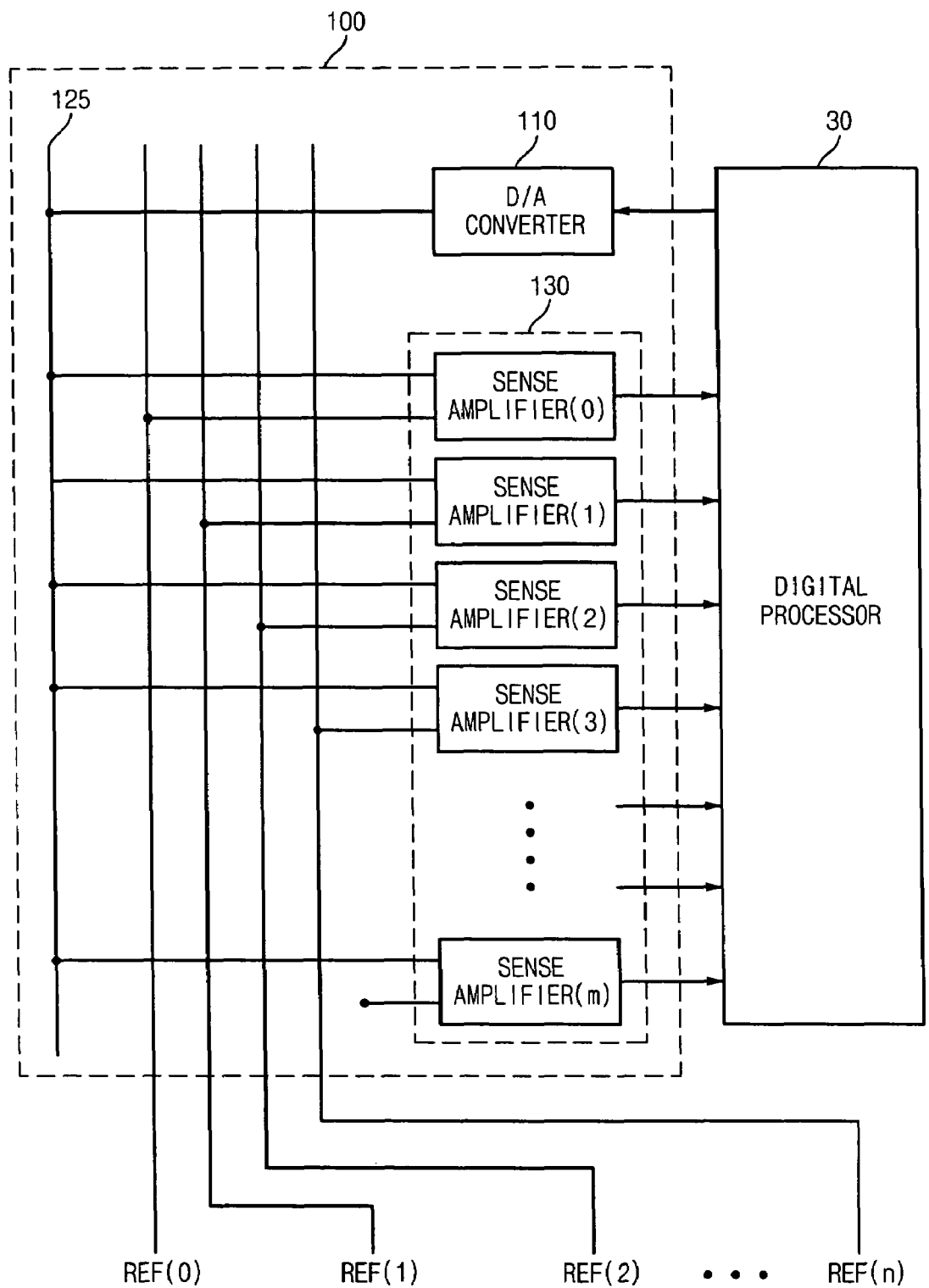
FIG. 13 is a diagram of a D/A converter and a sense amplifier array unit which are connected to a cell array block of FIG. 4.

FIG. 13 is a diagram of the D/A converter 110 and the sense amplifier array unit 130 which are connected to a cell array block 120 of FIG. 4.

The D/A converter 110 converts digital data applied from the digital processor 30 into analog data, and outputs the converted analog data into the common data bus unit 125. The sense amplifier array unit 130 comprises a plurality of sense amplifiers 0~m for sensing a plurality of read data as a plurality of data levels. Here, when data stored in the memory cell is n bits, the number of sense amplifiers is $2^n-1$.

The sense amplifier array unit 130 compares a plurality of data level voltages applied through the common data bus unit 125 with a plurality of reference voltages REF0~REFn, and outputs the comparison results into the digital processor 30.

Here, sensing critical voltages of the plurality of sense amplifiers are set to have different values. That is, the sense amplifier 0 is set to have the lowest sensing critical voltage, the sense amplifier 1 is set to have the second lowest sensing critical voltage, and the sense amplifier m is set to have the highest sensing critical voltage.

AS a result, data 11 and 10 can be distinguished in the sense amplifier 0, data 10 and 01 in the sense amplifier 1, and data 01 and 00 in the sense amplifier 2.

Figure 14:
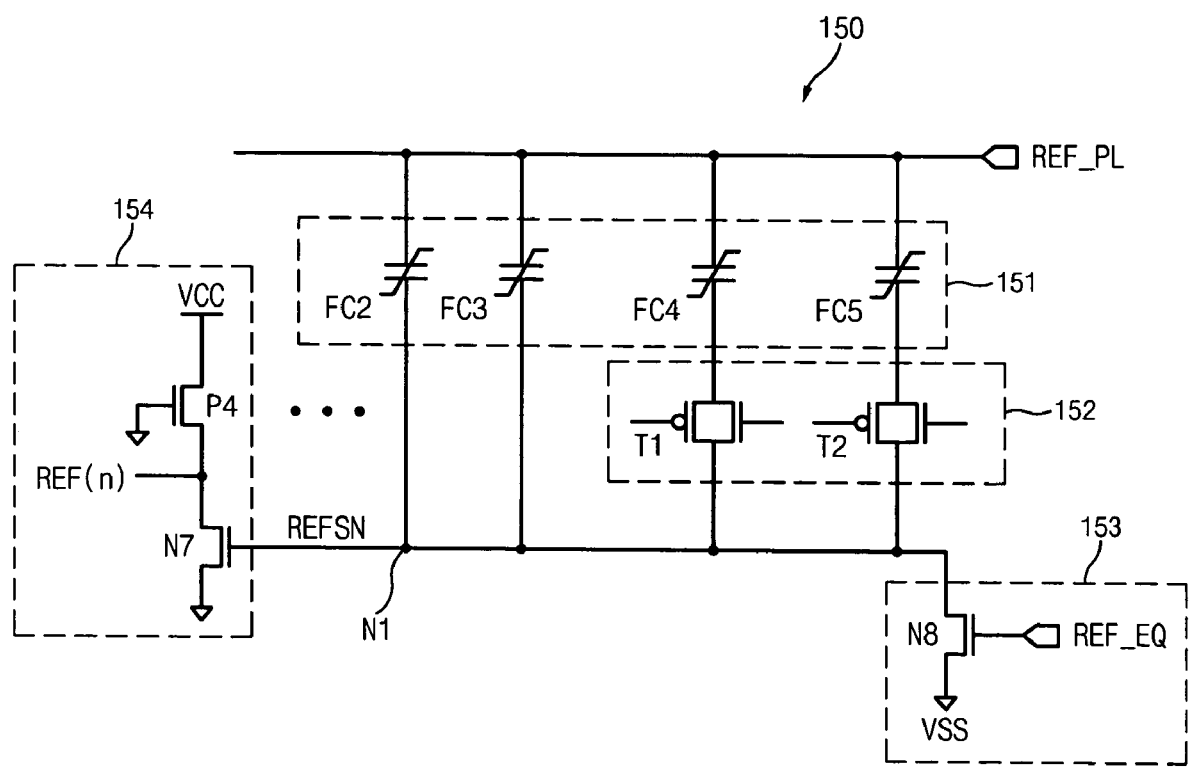
FIG. 14 is a circuit diagram of a reference voltage controller.

FIG. 14 is a circuit diagram of the reference voltage controller 150 for providing the reference voltage REF to the sense amplifier array unit 130 of FIG. 13.

The reference voltage controller 150 comprises a capacitor regulator 151, a switching unit 152, a precharge controller 153 and an output driving unit 154.

The capacitor regulator 151 comprises a plurality of ferroelectric capacitors FC2~FC5 connected in parallel to a plateline control signal REF_PL applying terminal. The switching unit 152 which comprises a plurality of transmission gates T1 and T2 selectively controls connection between the node N1 and the nonvolatile ferroelectric capacitors FC4 and FC5.

The number of the plurality of nonvolatile ferroelectric capacitors FC2~FC5 which are turned on is differently regulated depending on control of the switching unit 152. As a result, the size of capacitors is selectively regulated to control a voltage level of a reference voltage control signal REFSN differently.

The precharge controller 153 comprises an NMOS transistor N8 for initializing the node N1. The NMOS transistor N8, connected between the node N1 and the ground voltage terminal, has a gate to receive an equalizing signal REF_EQ. In the precharge mode, the equalizing signal REF_EQ becomes at a high level to turn on the NMOS transistor N8, thereby precharging the reference voltage control signal REFSN to a low level.

The output driving unit 154 comprises a PMOS transistor P4 and an NMOS transistor N7 connected between the power voltage terminal and the ground voltage terminal. The PMOS transistor P4 has a gate connected to the ground voltage terminal, and the NMOS transistor N7 has a gate to receive the reference voltage control signal REFSN. Since the PMOS transistor P4 is continuously kept turned on, the voltage levels of the reference voltages REF(n) outputted in response to the reference voltage control signal REFSN are determined.

Figure 15:
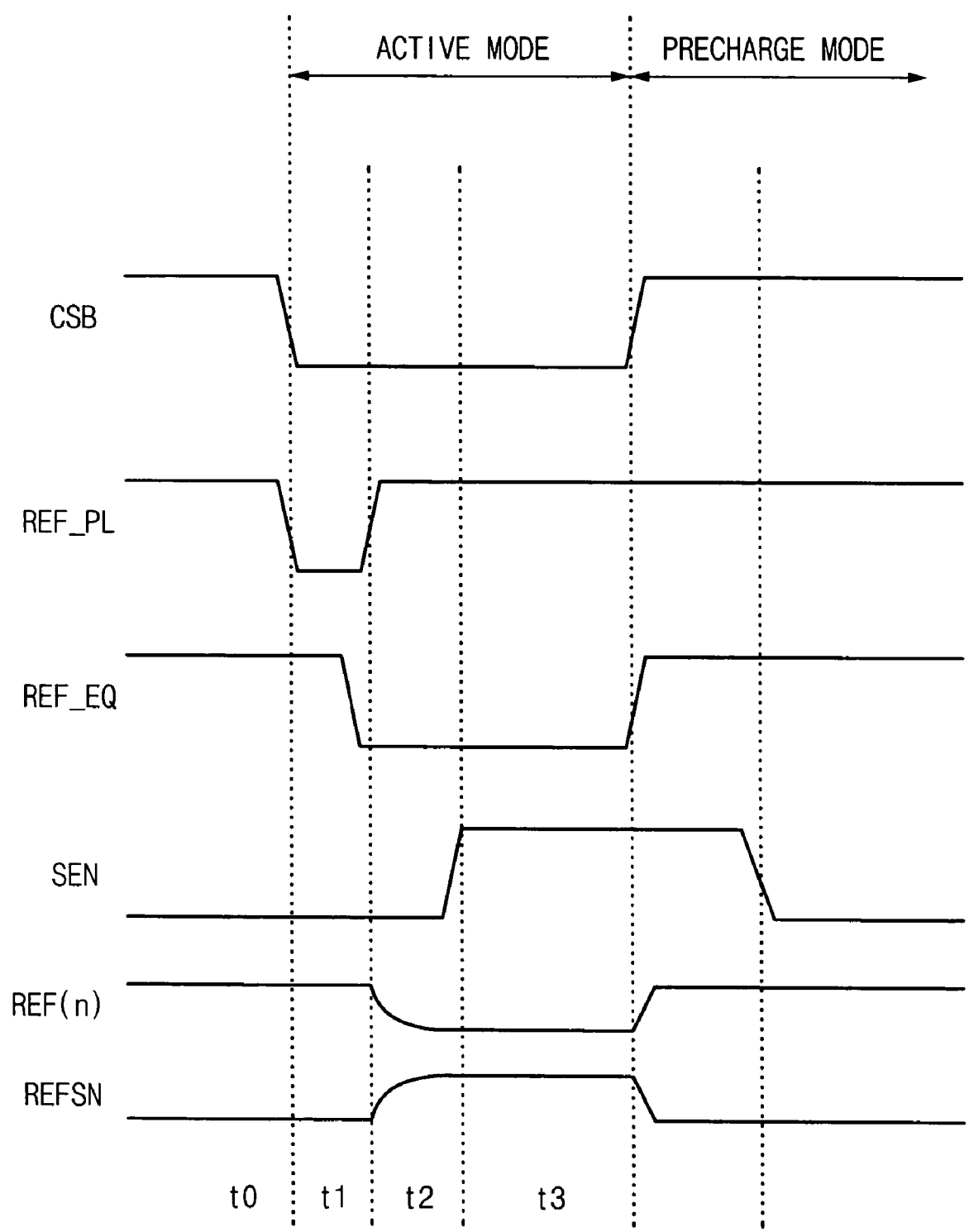
FIG. 15 is a timing diagram illustrating the operation of the reference voltage controller of FIG. 14.

FIG. 15 is a timing diagram illustrating the operation of the reference voltage controller 150 of FIG. 14.

In an interval t0, a chip selecting signal CSB, the plateline control signal REF_PL and the equalizing signal REF_EQ are at a high level, and a sense amplifier enable signal SEN is maintained at a low level. AS a result, the node N1 is initialized to a low level by the NMOS transistor N8.

When an interval t1 starts, the chip selecting signal CSB and the plateline control signal REF_PL transits to a low level. Then, when an interval t2 starts, if the plateline control signal REF_PL becomes at the high level again, the reference control signal REFSN becomes at a high level to output the reference voltages REF(n).

Thereafter, if a precharge interval after an interval t3 starts, the chip selecting signal CSB and the equalizing signal REF_EQ transit to the high level to initialize the reference control signal REFSN.

Figure 16:
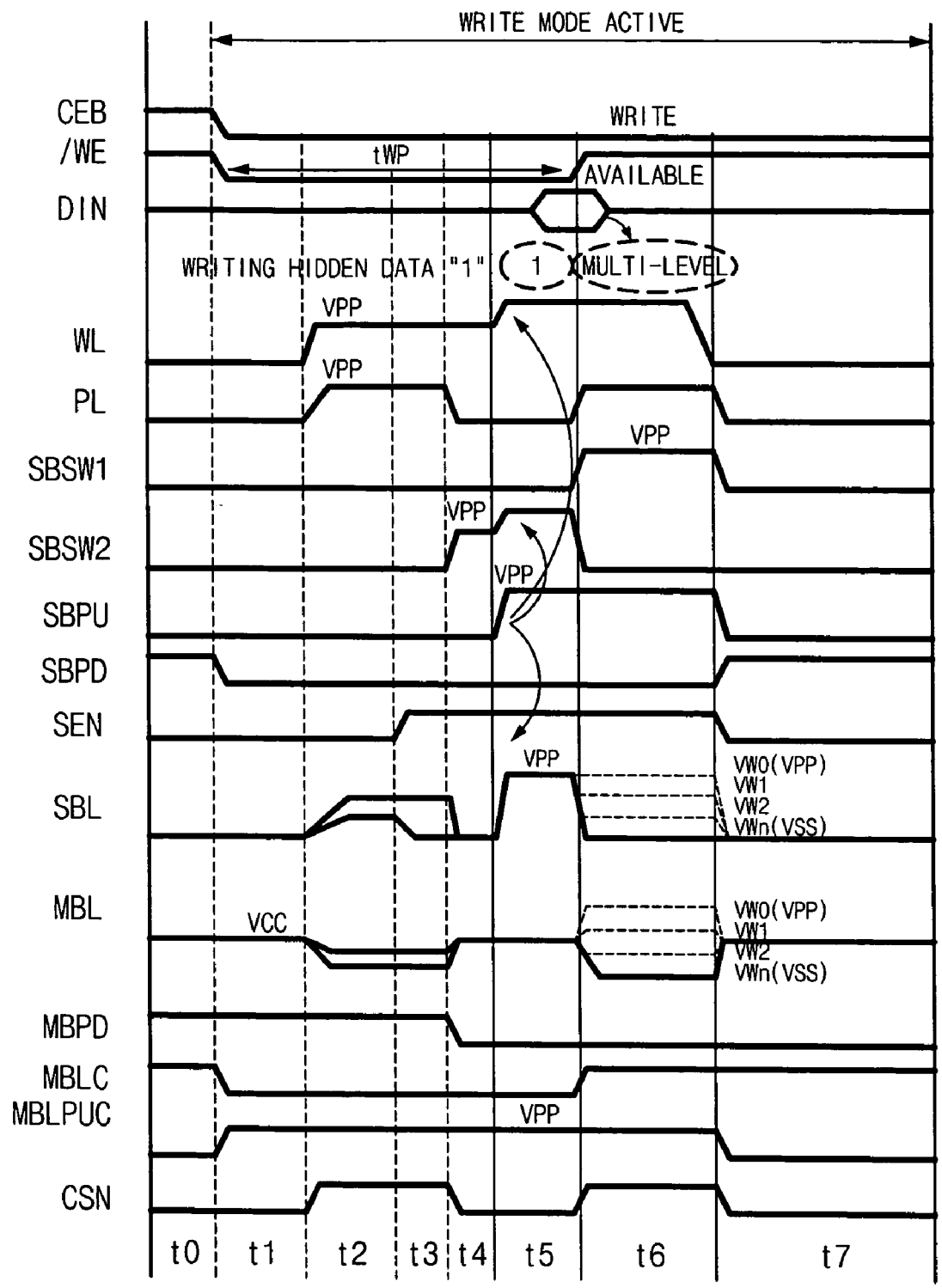
FIG. 16 is a timing diagram illustrating the write mode of the data control device using a nonvolatile ferroelectric memory according to an embodiment of the present invention.

FIG. 16 is a timing diagram illustrating the write mode of the data control device using a nonvolatile ferroelectric memory according to an embodiment of the present invention.

When the interval t1 starts, if the chip selecting signal CSB and a write enable signal /WE are disabled to a low level, the write operation becomes active. Here, the sub bitline pull-down signal SBPD and the main bitline control signal MBLC are disabled to a low level. The main bitline pull-up control signal MBLPUC is enabled to a high level.

Thereafter, when an interval t2 starts, if the wordline WL and the plateline PL are enabled to a pumping voltage VPP, the voltage level of the sub bitline SBL rises. Then, the column selecting signal CSN is enabled to connect the common data bus unit 125 to the main bitline MBL.

Next, when a data sensing interval t3 starts, the sense amplifier enable signal SEN is enabled to apply cell data to the main bitline MBL.

When an interval t4 starts, the plateline PL is disabled to a low level, and the sub bitline selecting signal SBSW2 is enabled to a high level. Here, the sub bitline SBL is disabled to a low level.

In an interval t5, hidden data "1" is written. When the interval t5 starts, the voltage of the wordline WL rises, and the sub bitline selecting signal SBSW2 is enabled to the pumping voltage VPP level in response to the sub bitline pull-up signal SBPU. As a result, the voltage level of the sub bitline SBL rises to the pumping voltage VPP level.

In an interval t6, multi-level data can be written in response to the write enable signal /WE. When the interval t6 starts, the plateline PL is enabled again. Then, the sub bitline selecting signal SBSW1 rises to the pumping voltage VPP level, and the sub bitline selecting signal SBSW2 is disabled. Here, the main bitline control signal MBLC is enabled to a high level. Then, the column selecting signal CSN is enabled to connect the common data bus unit 125 to the main bitline MBL.

Therefore, while the sub bitline selecting signal SBSW1 is at the pumping voltage VPP level, a plurality of data can be written in the memory cell depending on multi-voltages VW0~VWn levels applied to the sub bitline SBL and the main bitline MBL.

When an interval t7 starts, the wordline WL, the plateline PL, the sub bitline selecting signal SBSW1 and the sub bitline pull-up signal SBPU are disabled. Then, the sub bitline pull-down signal SBPD is enabled, and the sense amplifier enable signal SEN is disabled. The main bitline pull-up control signal MBLPUC is disabled, and the main bitline MBL is precharged to the power voltage VCC level. Here, the column selecting signal CSN is disabled to disconnect the common data bus unit 125 to the main bitline MBL.

Figure 17:
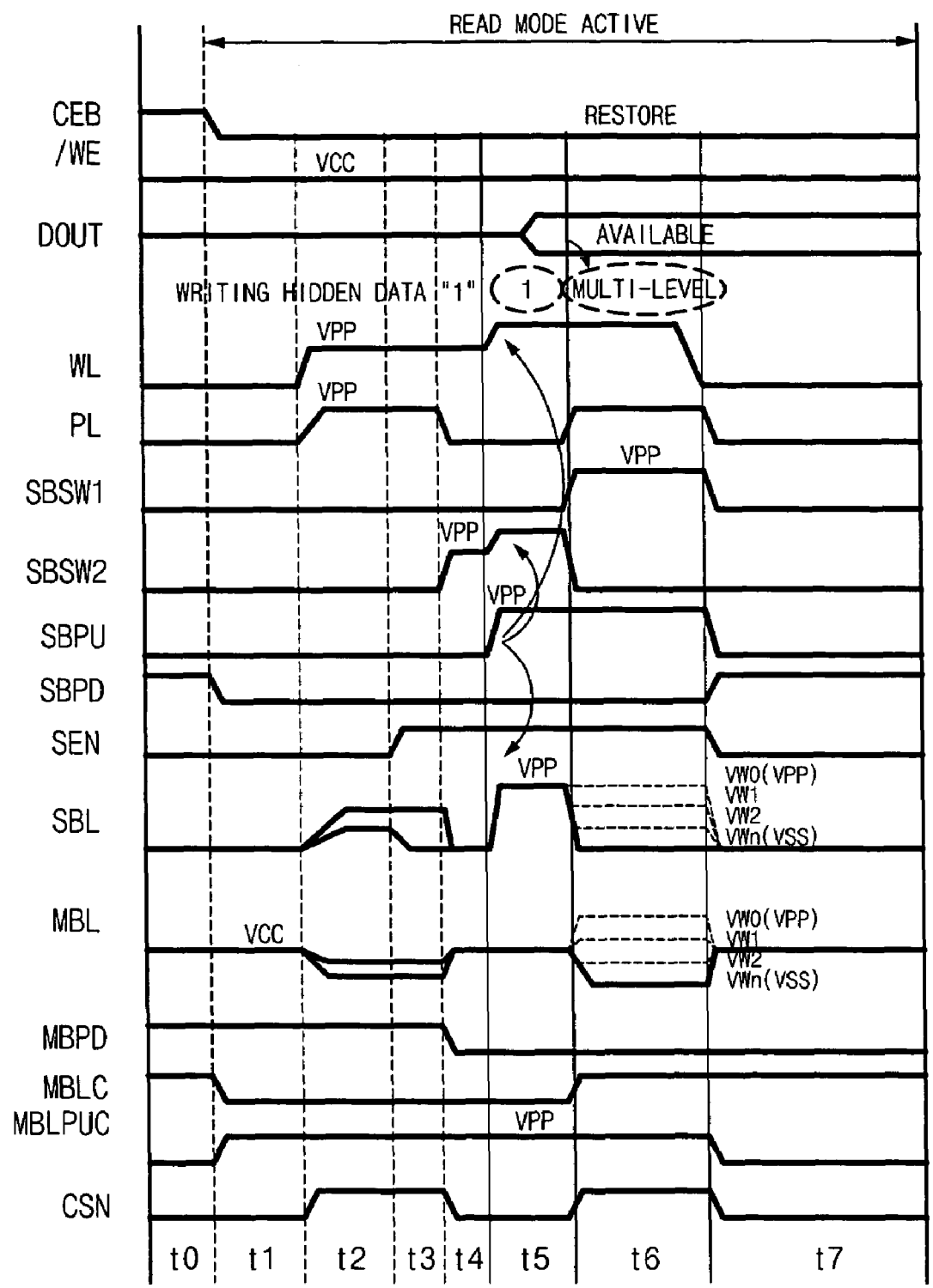
FIG. 17 is a timing diagram illustrating the read mode of the data control device using a nonvolatile ferroelectric memory according to an embodiment of the present invention.

FIG. 17 is a timing diagram illustrating the read mode of the data control device using a nonvolatile ferroelectric memory according to an embodiment of the present invention.

In the read mode, the write enable signal /WE is maintained at the power voltage VCC level. In the interval t2 and t3, data are sensed. In the interval tb, hidden data "1" is written, and a data output available interval is maintained after the interval tb.

In the interval t6, a plurality of multiple level data are restored. That is, while the sub bitline selecting signal SBSW1 is at the high level, the plurality of multiple level voltages VW0~VWn are applied to the sub bitline SbL and the main bitline MBL by feedback decoder loop, respectively. As a result, the multiple levels are restored in the memory cell.

During the interval t6, a plurality of data levels stored in the cell array block 120 are sensed, and outputted through the common data bus unit 125.

Although radio data such as image data and sound data are exemplified in the embodiment of the present invention, the invention is not limited to the particular forms disclosed. Rather, a plurality of data having different types can be stored in a unit cell of a nonvolatile ferroelectric memory.

As described above, radio data having different types such as image signals, sound signals and the rest signals are stored in a unit cell, thereby reducing the configuration of adjacent systems and decreasing the whole chip size remarkably.

What is claimed is:

1. A data control device using a nonvolatile ferroelectric memory, comprising:
   a radio data processing unit for converting radio data having different types into digital/analog signals, and for transmitting/receiving the converted signals wirelessly; and
   a FeRAM memory unit for encoding the radio data having different types and storing the encoded data in unit cells of a nonvolatile ferroelectric memory, respectively, for comparing a plurality of different cell data sensing voltages sensed in the nonvolatile ferroelectric memory with a plurality of previously set reference voltages, and for converting the comparison results into digital signals to output the converted signals into the radio data processor;
   wherein the FeRAM memory unit includes a sense amplifier array unit for comparing the plurality of different cell data sensing voltages in a read mode with a plurality of previously set reference voltages, and for outputting the comparison results into the radio data processing unit.

2. The device according to claim 1, wherein the radio data includes image data.

3. The device according to claim 1, wherein the radio data includes sound data.

4. The device according to claim 1, wherein the radio data processing unit comprises:
   a radio frequency unit for processing the radio data transmitted/received externally;
   an analog processor for converting the radio data applied from the radio frequency unit into analog signals; and
   a digital processor for converting the analog data applied from the analog processor into digital data.

5. The device according to claim 4, wherein the radio data processing unit further comprises an analog data input/output unit for controlling input/output of analog data and providing the analog data into the analog processor.

6. The device according to claim 4, wherein the radio data processing unit further comprises a digital data input/output unit for controlling input/output of digital data and providing the digital data to the digital processor.

7. The device according to claim 4, wherein the radio data processing unit further comprises an application processor which is connected to the digital processor and the FeRAM memory unit and performs an additional application process.

8. The device according to claim 1, wherein the FeRAM memory unit further comprises:
   a digital/analog converter for converting digital data, which are inputted from the radio data processing unit when the radio data are written, into analog data; and
   a cell array block for assigning regions by assorting the analog data from the digital/analog converter, and for encoding multiple data and storing the multiple data in the unit cell.

9. The device according to claim 8, wherein the cell array block comprises:
- a main bitline pull-up controller for pulling up the main bitline in response to a main bitline pull-up control signal;
- a main bitline sensing load unit for controlling sensing load of the main bitline in response to a main bitline control signal;
- a plurality of sub cell arrays each comprising the nonvolatile ferroelectric memory; and
- a column selecting array unit for selectively connecting a common data bus unit to the main bitline in response to a column selecting signal.

10. The device according to claim 1, wherein the sense amplifier array unit comprises a plurality of sense amplifiers for comparing and amplifying the plurality of different cell data sensing voltages sensed in the cell array block through a common data bus unit with a plurality of preset reference voltages, and for outputting a plurality of sensing data levels.

11. The device according to claim 1, wherein the sense amplifier array unit further comprises a reference voltage controller for providing the plurality of preset reference voltages to the sense amplifier array unit.

12. The device according to claim 11, wherein the reference voltage controller comprises:
- a capacitor regulator, comprising a plurality of nonvolatile ferroelectric capacitors, for controlling voltage levels of reference voltage control signals by selectively regulating a size of a capacitor in response to a plateline control signal;
- a switching unit for selectively controlling connection between the plurality of nonvolatile ferroelectric capacitors and the reference voltage control signal applying node;
- a precharge controller for precharging the reference voltage control signal applying node in response to an equalizing signal during a precharge mode; and
- an output driving unit for outputting the plurality of preset reference voltages depending on voltage levels of the reference voltage control signals.

13. The device according to claim 12, wherein the capacitor regulator comprises a plurality of nonvolatile ferroelectric capacitors connected in parallel between the plateline control signal applying terminal and the switching unit.

14. The device according to claim 12, wherein the switching unit comprises a plurality of transmission gates each connected between the plurality of nonvolatile ferroelectric capacitors and the reference voltage control signal applying nodes.

15. The device according to claim 12, wherein the precharge controller comprises a first NMOS transistor which is connected between the reference voltage control signal applying node and a ground voltage terminal and has a gate to receive the equalizing signal.

16. The device according to claim 12, wherein the output driving unit comprises a first PMOS transistor and a second NMOS transistor which are connected serially between a power voltage terminal and a ground voltage terminal,
wherein the first PMOS transistor has a gate connected to the ground voltage terminal, and the second NMOS transistor has a gate to receive the reference voltage control signal.

17. A data control device using a nonvolatile ferroelectric memory, comprising:
- a data processing unit for signal-processing a plurality of data having different types, and for transmitting/receiving the signal-processed data; and
- a FeRAM memory unit for encoding the plurality of data having different types and storing the encoded data in unit cells of a nonvolatile ferroelectric memory, and for comparing a plurality of cell different data sensing voltages sensed in the nonvolatile ferroelectric memory with a plurality of preset reference voltages and outputting the comparison results into the data processing unit;
wherein the FeRAM includes a sense amplifier array unit for comparing the plurality of different cell data sensing voltages in a read mode with the plurality of preset reference voltages, and for outputting the comparison results into the data processing unit.

18. The device according to claim 17, wherein the data processing unit performs a transmission/reception process of radio data, and the radio data includes at least one of image data and sound data.

19. The device according to claim 18, wherein the data processing unit comprises:
- a radio frequency unit for processing the radio data transmitted/received externally;
- an analog processor for converting the radio data applied from the radio frequency unit into analog signals; and
- a digital processor for converting analog data applied from the analog processor into digital data.

20. The device according to claim 18, wherein the FeRAM memory unit further comprises:
- a digital/analog converter for converting digital data, which are inputted from the radio data processing unit when the radio data are written, into analog data; and
- a cell array block for assigning regions by assorting the analog data from the digital/analog converter, and for encoding multiple data and storing the multiple data in the unit cell.

* * * * *